(12) United States Patent
Kito

(10) Patent No.: US 10,721,849 B2
(45) Date of Patent: Jul. 21, 2020

(54) COMPONENT DATA HANDLING DEVICE AND COMPONENT MOUNTING SYSTEM

(71) Applicant: FUJI CORPORATION, Chiryu (JP)

(72) Inventor: Shuichiro Kito, Toyota (JP)

(73) Assignee: FUJI CORPORATION, Chiryu (JP)

( * ) Notice: Subject to any disclaimer, the term of this patent is extended or adjusted under 35 U.S.C. 154(b) by 357 days.

(21) Appl. No.: 15/324,422

(22) PCT Filed: Jul. 28, 2014

(86) PCT No.: PCT/JP2014/069860
§ 371 (c)(1),
(2) Date: Jan. 6, 2017

(87) PCT Pub. No.: WO2016/016933
PCT Pub. Date: Feb. 4, 2016

(65) Prior Publication Data
US 2017/0202117 A1    Jul. 13, 2017

(51) Int. Cl.
*H05K 13/08* (2006.01)
*H05K 13/04* (2006.01)

(52) U.S. Cl.
CPC .......... *H05K 13/08* (2013.01); *H05K 13/0465* (2013.01); *H05K 13/0817* (2018.08)

(58) Field of Classification Search
CPC . G06T 2207/10004; G06T 2207/20008; G06T 2207/30141; G06T 3/4053; G06T 7/0004; H04N 1/19594; H05K 13/08; H05K 13/081
See application file for complete search history.

(56) References Cited

U.S. PATENT DOCUMENTS

| 6,532,010 B2* | 3/2003 | Sakamoto | .......... G01C 21/3638 |
| | | | 345/419 |
| 9,936,620 B2* | 4/2018 | Mori | .................. H05K 13/0417 |
| 2010/0188417 A1* | 7/2010 | Kojitani | ............. H05K 13/0815 |
| | | | 345/593 |

(Continued)

FOREIGN PATENT DOCUMENTS

| CN | 1831687 A | 9/2006 |
| DE | 10 2013 203 A1 | 10/2013 |
| JP | 2001-209792 A | 8/2001 |

(Continued)

OTHER PUBLICATIONS

Office Action dated Jun. 25, 2018 in corresponding Japanese Patent Application No. 2016-537626 (with English Translation), 7 pages.

(Continued)

*Primary Examiner* — Minh N Trinh
(74) *Attorney, Agent, or Firm* — Oblon, McClelland, Maier & Neustadt, L.L.P.

(57) ABSTRACT

A virtual terminal definition which defines that a terminal does not exist with respect to component data on one side, at a position of the terminal which does not exist in the component data on one side, and exists in the component data on the other side, among plural pieces of component data in which a positional coordinate between the existing terminals, and the terminal size are substantially the same as each other, and the number of terminals is different, is added.

5 Claims, 16 Drawing Sheets

(56) References Cited

U.S. PATENT DOCUMENTS

2014/0278212 A1* 9/2014 Torgersrud ............. G01B 21/16
　　　　　　　　　　　　　　　　　　　　　　702/150
2017/0202117 A1* 7/2017 Kito ....................... H05K 13/04

FOREIGN PATENT DOCUMENTS

| JP | 2005-276990 A | 10/2005 |
| JP | 2006-245483 A | 9/2006 |
| JP | 2007-59546 A | 3/2007 |
| JP | 2013-219254 A | 10/2013 |

OTHER PUBLICATIONS

International Search Report dated Oct. 28, 2814 in PCT/JP2014/069660 filed Jul. 28, 2014.
Extended European Search Report dated Jun. 4, 2018 in Patent Application No. 14898741.5, 10 pages.

* cited by examiner

COMPONENT DATA HANDLING DEVICE AND COMPONENT MOUNTING SYSTEM

TECHNICAL FIELD

The present application relates to a component data handling device which handles component data which is used when a component having a terminal is mounted on a mounting target by a component mounting machine, and a component data handling method, a component mounting system including the component mounting machine and the component data handling device.

BACKGROUND ART

In the related art, in this type of component mounting system, as a device which mounts a component having a terminal on a board S, a device which images the component having a terminal by a camera before the mounting, and determines a state of the component based on an acquired captured image and component data stored in advance, is known. For example, in PTL 1, a device which accommodates the captured image acquired by imaging the component having a terminal by the camera before the mounting in an image memory, reads out corresponding component data (the size, the position, or the number of characteristic members, such as components, leads, or ball terminals) from a component data storage memory, recognizes the characteristic members of the component by performing image process with respect to the captured image based on the read-out component data, and computes the center or inclination of the component from the recognition result, is disclosed.

PTL 1: JP-A-2007-59546

DISCLOSURE

However, the terminal sizes between the existing terminals and the terminal positions (or a terminal-to-terminal pitch) are substantially the same as each other in a bump component or a lead component, such as a ball grid array (BGA) or a quad flat package (QFP), but there are many cases where the number of terminals is different. Therefore, in a case where the terminal (characteristic member) of the component is recognized from the captured image, in the captured image, there is a possibility that the type of component is discriminated according to whether or not it is possible to recognize only the assigned number of terminals on the terminal position (or on the terminal-to-terminal pitch) assigned by the terminal having the size assigned by the component data. However, there is a case where the terminal cannot be recognized due to unclear reflection of a part of the terminal according to the imaging condition, or this type of analogue is misrecognized as the terminal due to glare, such as a mark or a wiring pattern attached to the component, and it is not easy to correctly recognize the terminal (characteristic member).

A main object of the present disclosure is to suppress the misrecognition of the component due to the component data in which the terminal size between the existing terminals, and the terminal-to-terminal pitch or the terminal position are substantially the same as each other, and the number of terminals is different, and to recognize the component correctly.

The present disclosure employs the following device for achieving the above-described main object.

A component data handling device according to the disclosure handles component data which is used when a component having a terminal is mounted on a mounting target by a component mounting machine, and includes: a component data storage device for making it possible to store plural pieces of the component data including a terminal size, a terminal-to-terminal pitch or a terminal position, and the number of terminals; and a component data extracting device for extracting the component data in which the terminal size, and the terminal-to-terminal pitch or the terminal position are substantially the same as each other, and the number of terminals is different, among the plural pieces of component data which are stored in the component data storage device.

In the component data handling device of the present disclosure, the plural pieces of component data including the terminal size, the terminal-to-terminal pitch or the terminal position, and among the plural pieces of component data, the number of terminals, are stored, and among the stored plural pieces of component data, the component data in which the terminal size, and the terminal-to-terminal pitch or the terminal position are substantially the same as each other, and the number of terminals is different, is extracted. Accordingly, since it is possible to extract the plural pieces of component data which has a concern of being misrecognized, by using the extracted component data, it is possible to suppress misrecognition of the component having a terminal to be mounted, and to recognize the component correctly. Here, "component having a terminal" can be an example which indicates a component having a bump which has a bump terminal, or a component having a lead which has a lead terminal.

In the component data handling device of the present disclosure, a displaying device for integrally displaying the component data extracted by the component data extracting device, for each piece of the component data in which the terminal size, and the terminal-to-terminal pitch or the terminal position, are substantially the same as each other, can also be provided. By doing so, the user can easily confirm the plural pieces of component data which has a concern of being misrecognized via the displaying device.

In addition, in the component data handling device of the present disclosure, a component data creating device for creating the component data by detecting a position at which a terminal exists only on one side on the terminal-to-terminal pitch or on the terminal position between one piece of the component data and another piece of the component data, and by adding information that indicates that the terminal does not exist at the detected position, among the plural pieces of component data which are extracted by the component data extracting device, and in which the terminal size, and the terminal-to-terminal pitch or the terminal position, are substantially the same as each other, and the number of terminals is different, can also be provided. By doing so, since it is possible to recognize the terminal by using the information that indicates that the terminal exists and the information that indicates that the terminal does not exist on the terminal-to-terminal pitch or on the terminal position, compared to a case where only the information which indicates that the terminal exists on the terminal-to-terminal pitch or on the terminal position, is used, it is possible to more reliably suppress the misrecognition of the terminal. In the component data handling device of the present disclosure of the aspect, a captured image acquisition device for acquiring a captured image of the component having a terminal which is imaged before mounting; and a discriminating device for discriminating the component having a terminal based on the component data stored in the component data storage device or the component data created by the component data creating device, and the acquired captured image, can also be provided.

According to the present disclosure, there is provided a component data handling method which handles component data which is used when a component having a terminal is mounted on a mounting target by a component mounting machine, including: storing plural pieces of the component data including a terminal size, a terminal-to-terminal pitch or a terminal position, and the number of terminals; and extracting the component data in which the terminal size, and the terminal-to-terminal pitch or the terminal position are substantially the same as each other, and the number of terminals is different, among the stored plural pieces of component data.

According to the component data handling method of the present disclosure, the plural pieces of component data including the terminal size, the terminal-to-terminal pitch or the terminal position, and the number of terminals, are stored, and among the stored plural pieces of component data, the component data in which the terminal size, and the terminal-to-terminal pitch or the terminal position are substantially the same as each other, and the number of terminals is different, is extracted. Accordingly, since it is possible to extract the plural pieces of component data which has a concern of being misrecognized, by using the extracted component data, it is possible to suppress misrecognition of the component having a terminal to be mounted, and to correctly recognize the component.

According to the present disclosure, there is provided a component mounting system including: a component mounting machine which mounts a component having a terminal on a mounting target; and a component data handling device of the present disclosure according to any of the aspects which handles component data which is used when the component having a terminal is mounted by the component mounting machine.

According to the present disclosure, there is provided a component mounting system including a component mounting machine which mounts a component having a terminal on a mounting target, and a component data handling device which handles component data which is used when the component having a terminal is mounted by the component mounting machine, in which the component data handling device includes a component data storage device for making it possible to store plural pieces of the component data including a terminal size, a terminal-to-terminal pitch or a terminal position, and the number of terminals, a component data extracting device for extracting the component data in which the terminal size, and the terminal-to-terminal pitch or the terminal position are substantially the same as each other, and the number of terminals is different, among the plural pieces of component data which are stored in the component data storage device, and a component data creating device for creating the component data by detecting a position at which a terminal exists only on one side on the terminal-to-terminal pitch or on the terminal position between one piece of the component data and another piece of the component data, and by adding information that indicates that the terminal does not exist at the detected position, among the plural pieces of component data which are extracted by the component data extracting device, and in which the terminal size, and the terminal-to-terminal pitch or the terminal position, are substantially the same as each other, and the number of terminals is different, and in which the component mounting machine includes a captured image acquisition device for acquiring a captured image of the component having a terminal which is imaged before mounting, and a discriminating device for discriminating the component having a terminal based on the component data stored in the component data storage device or the component data created by the component data creating device, and the acquired captured image.

DESCRIPTION OF EMBODIMENTS

Next, an aspect for realizing the present disclosure is described by using the embodiment.

Figure 1:
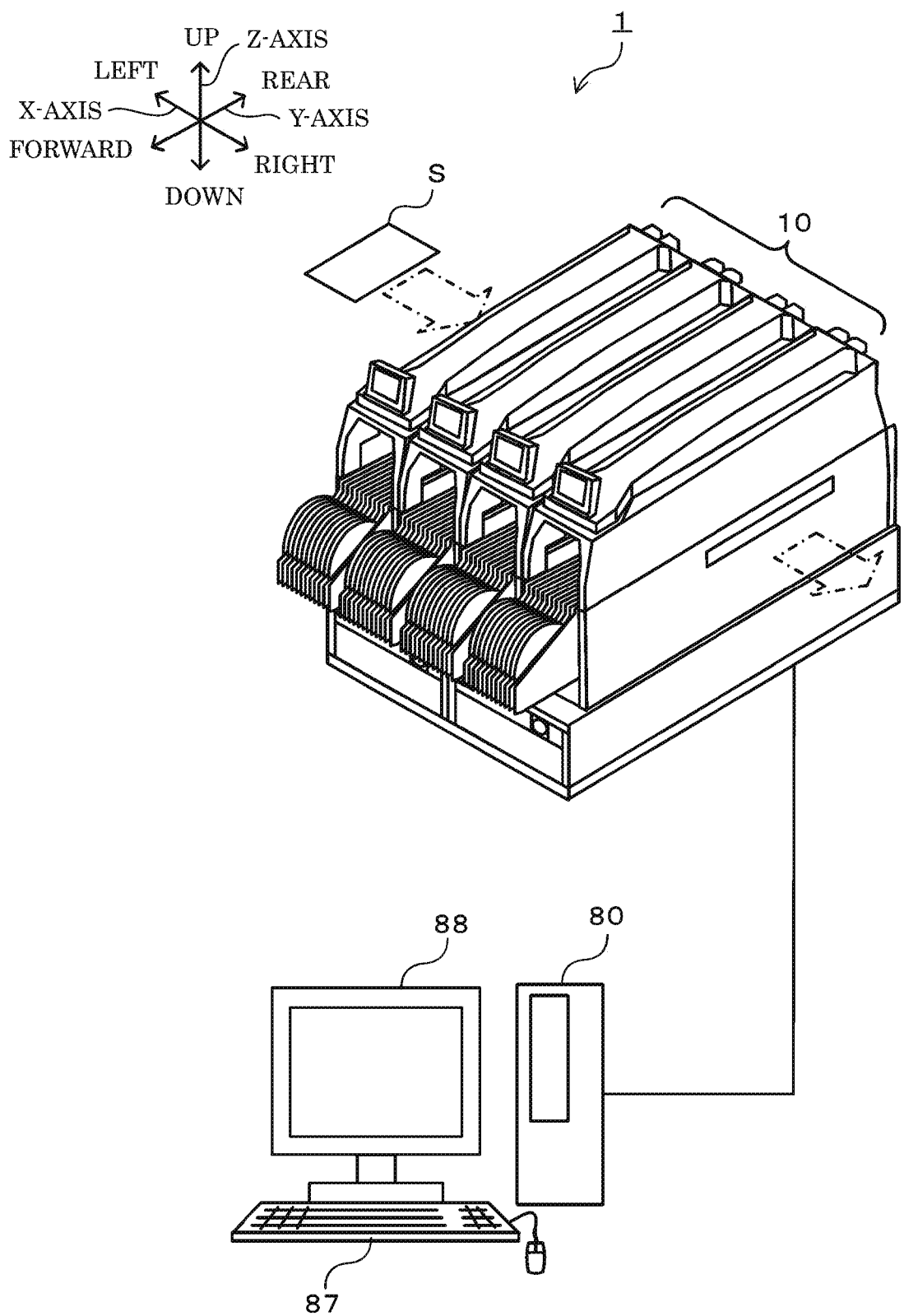
FIG. 1 is a configuration view illustrating a schematic configuration of a component mounting system 1 as an embodiment of the present disclosure.
Figure 2:
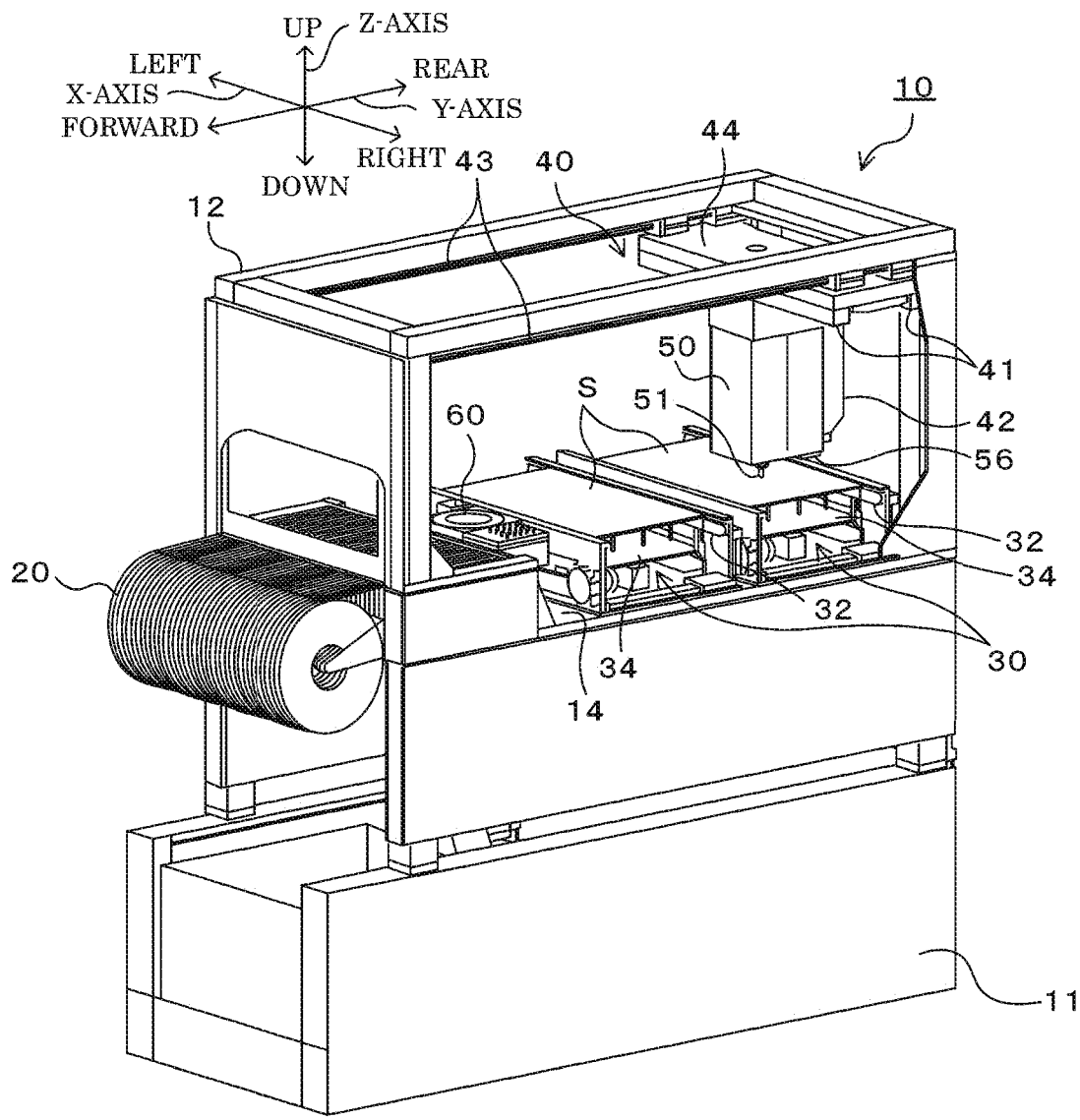
FIG. 2 is a configuration view illustrating a schematic configuration of a component mounting machine 10.
Figure 3:
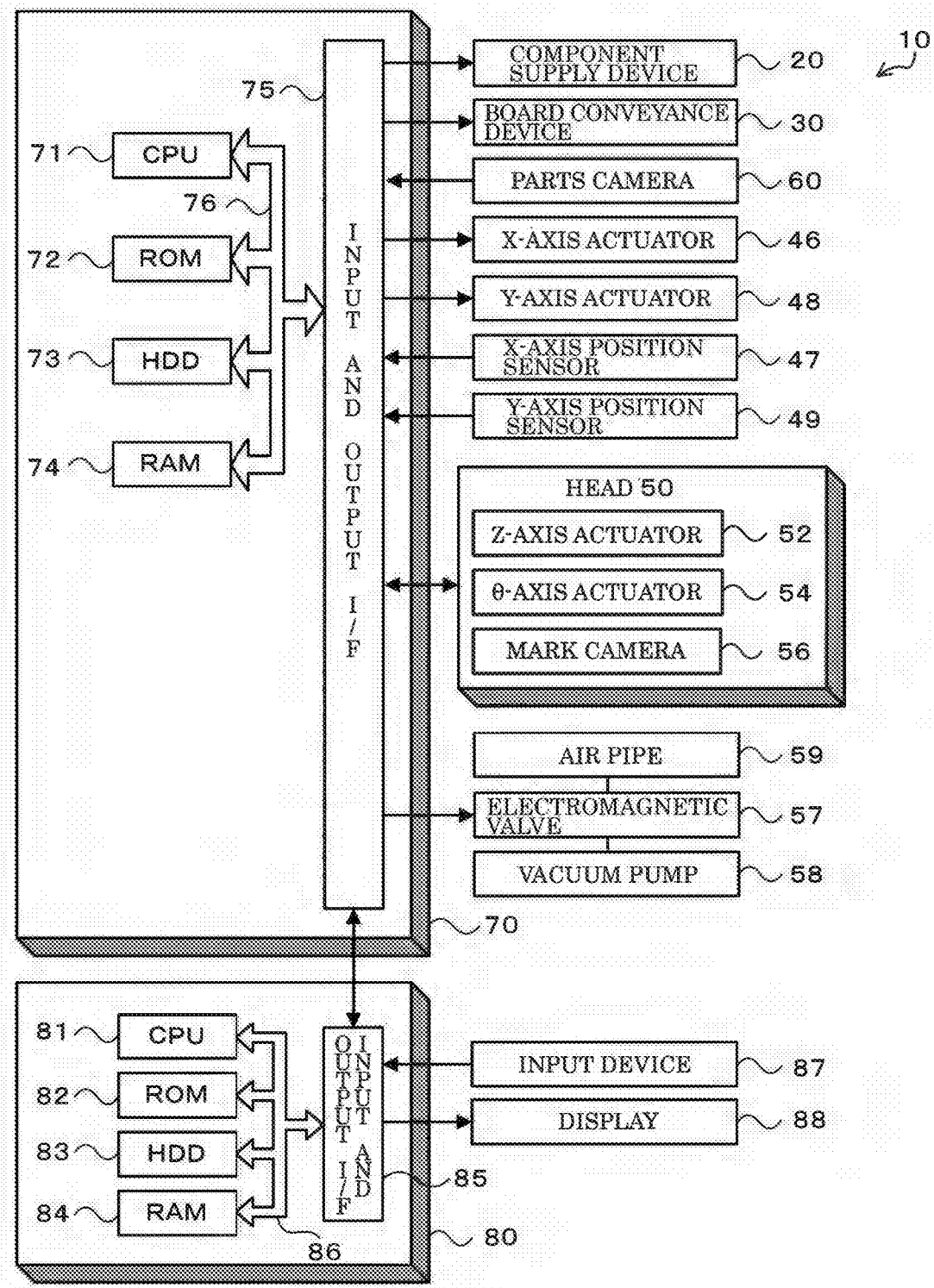
FIG. 3 is an explanation view illustrating an electric connection relationship between the component mounting machine 10 and a management device 80.

FIG. 1 is a configuration view illustrating a schematic configuration of a component mounting system 1 as an embodiment of the present disclosure, FIG. 2 is a configuration view illustrating a schematic configuration of a component mounting machine 10, and FIG. 3 is an explanation view illustrating an electric connection relationship between the component mounting machine 10 and a management device 80. In addition, the left-right direction of FIG. 1 and FIG. 2 is the X-axis direction, the forward (near)-rear (far) direction is the Y-axis direction, and the up-down direction is the Z-axis direction.

As illustrated in FIG. 1, the component mounting system 1 includes the plurality of component mounting machines 10 which are disposed to be aligned in the conveyance direction (board conveyance direction) of a printed circuit board S, and the management device 80 which manages the entire component mounting system.

As illustrated in FIG. 2, as an external appearance, the component mounting machine 10 is configured of a base 11, and a main body frame 12 which is supported by the base 11. As illustrated in FIG. 2, the component mounting machine 10 includes a support table 14 which is provided in a lower step portion of the main body frame 12, a board conveyance device 30 which conveys the board S, a component supply device 20 which is installed to be attachable and detachable to and from the support table 14, and supplies a component P, a head 50 which suctions the component P supplied by the component supply device 20 to a suction nozzle 51, and mounts the component P onto the board S conveyed by the board conveyance device 30, an XY robot 40 which moves the head 50 in the XY-direction, and a control device 70 (refer to FIG. 3) which controls the entire mounting machine. In addition, the component mounting machine 10 also additionally includes a mark camera 56 for imaging a board positioning fiducial mark which is provided in the head 50, and is attached to the board S, or a parts camera 60 for imaging a suctioned posture of the component P suctioned to the suction nozzle 51.

As illustrated in FIG. 2, in the embodiment, the board conveyance device 30 is configured as a dual lane type conveyance device in which two board conveyance paths are provided. The board conveyance device 30 is installed in the center portion in the forward-rear direction (Y-axis direction) in the support table 14. In addition, the board conveyance device 30 is provided with a belt conveyor device 32, and conveys the board S to the right (board conveyance direction) from the left of FIG. 1 by driving the belt conveyor device 32. In the center portion in the board conveyance direction (X-axis direction) of the board conveyance device 30, a back-up plate 34 which can be lifted and lowered by a lifting and lowering device which is not illustrated, is provided. When the board S is conveyed to an upper part of the back-up plate 34 by the board conveyance device 30, as being lifted by the driving of the lifting and lowering device, the back-up plate 34 backs up the board S from a rear surface side.

As illustrated in FIG. 3, the head 50 includes a Z-axis actuator 52 which moves the suction nozzle 51 in the Z-axis (up-and-down) direction, and a θ-axis actuator 54 which rotates the suction nozzle 51 around the Z-axis. A suction port of the suction nozzle 51 selectively communicates with any one of a vacuum pump 58 and an air pipe 59 via an electromagnetic valve 57. As the control device 70 drives the electromagnetic valve 57 so that the suction port of the suction nozzle 51 communicates with the vacuum pump 58, it is possible to suction the component P by making a negative pressure act on the suction port, and as the control device 70 drives the electromagnetic valve 57 so that the suction port of the suction nozzle 51 communicates with the air pipe 59, it is possible to release the suctioned state of the component P by making a positive pressure act on the suction port.

As illustrated in FIG. 2, the XY robot 40 includes one pair of left and right Y-axis guide rails 43 which are provided along the forward-rear direction (Y-axis direction) in the upper step portion of the main body frame 12, a long Y-axis slider 44 which can move along the Y-axis guide rail 43 in a state of being bridged over the one pair of left and right Y-axis guide rails 43, an X-axis guide rail 41 which is provided along the left-right direction (X-axis direction) on a lower surface of the Y-axis slider 44, and an X-axis slider 42 which can move along the X-axis guide rail 41. The head 50 attached to the X-axis slider 42, and as the control device 70 drives and controls the XY robot 40, it is possible to move the head 50 to an arbitrary position on the XY-plane.

The parts camera 60 is disposed on the support table 14 on a front side of the board conveyance device 30. When the component P suctioned to the suction nozzle 51 passes through the upper part of the parts camera 60, the parts camera 60 images the component P, and outputs an acquired captured image to the control device 70. As the control device 70 performs image processing with respect to the captured image imaged by the parts camera 60, it is possible to identify whether or not the component P suctioned to the suction nozzle 51 is a correct component, or determines whether or not the component P is suctioned to the suction nozzle 51 correctly.

Figure 4:
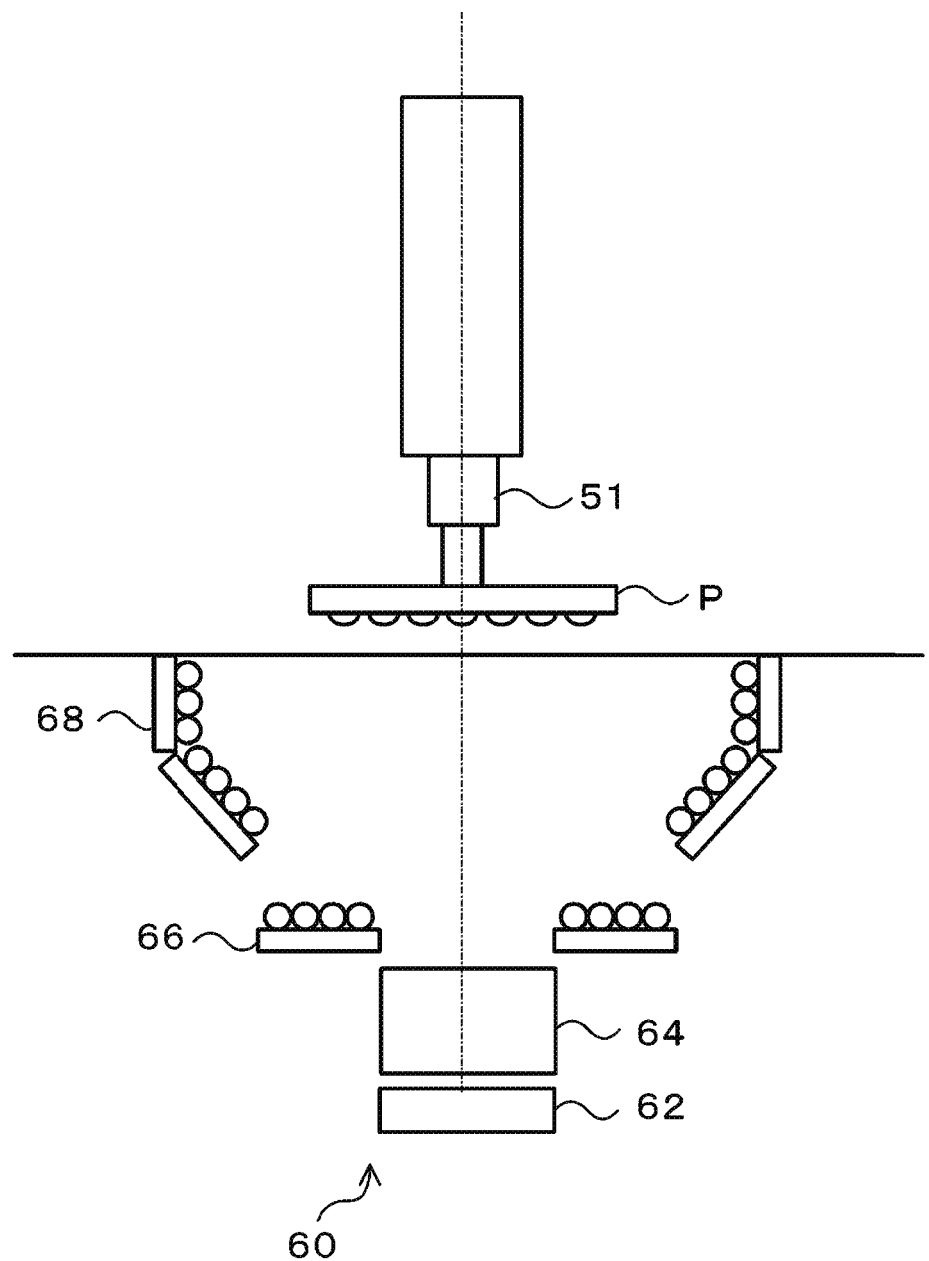
FIG. 4 is a configuration view illustrating a schematic configuration of a parts camera 60.

In addition, as illustrated in FIG. 4, the parts camera 60 includes an imaging device 62 which has a quadrate or rectangular imaging region in which a plurality of light receiving elements are two-dimensionally arranged, a lens 64 which is provided above the imaging device 62, a first lighting device 66 which emits emitted light immediately from below the component P when imaging the component P, and a second lighting device 68 which emits the emitted light diagonally from below the component P when imaging the component P. The second lighting device 68 is used as an illumination in a case of capturing a bump component which is a component P having a bump (semispherical shape) terminal, such as a BGA. Accordingly, it is possible to uniformly cast the light beam to the bump terminal, and to acquire an excellent captured image. In addition, as the imaging device 62, for example, a charge coupled device (CCD) or a complementary metal-oxide semiconductor (CMOS) can be used.

The control device 70 is configured as a microprocessor in which a CPU 71 is the center thereof, and in addition to the CPU 71, a ROM 72, an HDD 73, a RAM 74, and an input and output interface 75, are provided. These are electrically connected to each other via a bus 76. In the control device 70, a positional signal from an X-axis position sensor 47 which senses a position of the X-axis slider 42, a positional signal from a Y-axis position sensor 49 which senses a position of the Y-axis slider 44, an image signal from the mark camera 56, and an image signal from the parts camera 60, are input via the input and output interface 75. Meanwhile, from the control device 70, a control signal to the component supply device 20, a control signal to the board conveyance device 30, a drive signal to an X-axis actuator 46 which moves the X-axis slider 42, a driving signal to a Y-axis actuator 48 which moves the Y-axis slider 44, a driving signal to the Z-axis actuator 52, a driving signal to the θ-axis actuator 54, and a driving signal to the electromagnetic valve 57, are output via the input and output interface 75. In addition, the control device 70 is connected to the management device 80 to be capable of bidirectionally communicating therewith, and exchanges data or control signals therewith.

The management device 80 is, for example, a general-purpose computer, and is provided with a CPU 81, a ROM 82, an HDD 83, a RAM 84, and an input and output interface 85. These are electrically connected to each other via a bus 86. In the management device 80, an input signal from an input device 87, such as a mouse or a keyboard, is input via the input and output interface 85. In addition, from the management device 80, an image signal to a display 88 is output via the input and output interface 85. The HDD 83 stores a production plan of the board S. Here, the production plan of the board S is a plan which determines which component will be mounted on the board S in which order in each component mounting machine 10, or how many boards S which has the component mounted thereon in this manner will be made. In the production plan, board data related to the board to be produced, head data related to the head 50 to be used, nozzle data related to the suction nozzle 51 to be used, component data related to the component to be mounted, and mounting position data related to the mounting positions of each component, are included. The management device 80 creates the production plan based on the data (the number of components to be produced, the board data, the component data, or the mounting position data) input by an operator via the input device 87, and sends the created production plan to each component mounting machine 10.

Figure 5:
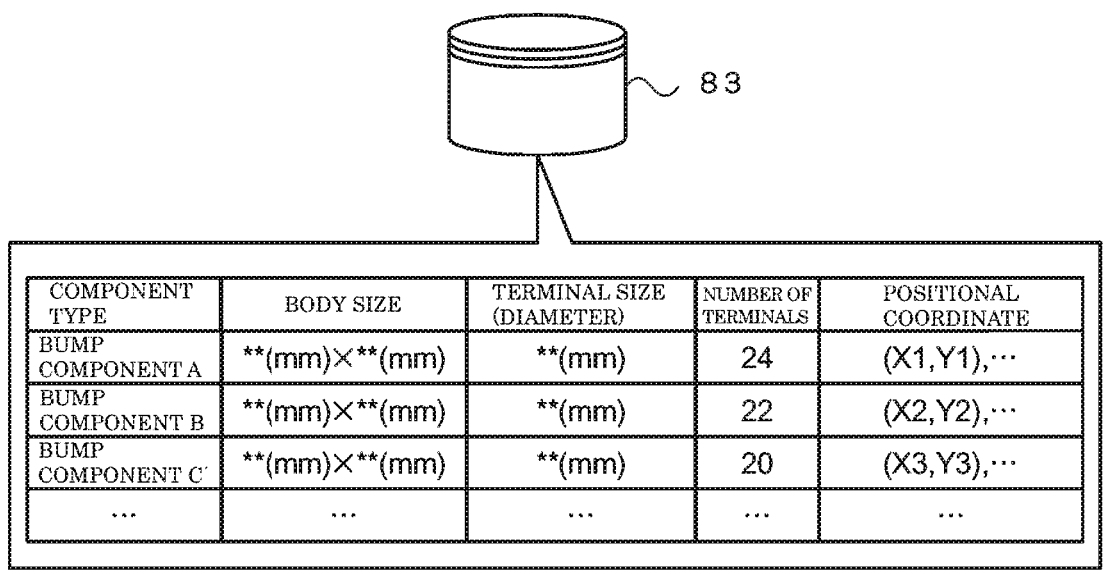
FIG. 5 is an explanation view illustrating an example of component data stored in an HDD 83 of the management device 80.

FIG. 5 is an explanation view illustrating an example of the component data stored in the HDD 83. The component data is input by the operator by using the input device 87, and each time the component data is input, the component data is stored in the HDD 83. As illustrated in FIG. 5, the component data includes the component type which indicates the type of the component P, such as the bump component or the lead component, the body size which indicates the external size of the component P, the terminal size which indicates the size (terminal diameter) of the terminal (the bump terminal or the lead terminal), the number of terminals, a positional coordinate of each terminal, or the terminal-to-terminal pitch. In addition, the component data also includes a terminal definition which defines that the terminal exists here by the positional coordinate of each terminal or the terminal-to-terminal pitch. Furthermore, there is a case where a virtual terminal definition is added to the component data. The virtual terminal definition defines that the terminal does not exist at an assigned position, and is added to the component data by component data creating process which will be described later. The terminal definition or the virtual terminal definition of the component data will be described later in detail, and are used when identifying the type of the component P from the captured image acquired by imaging the component P suctioned to the suction nozzle 51 by the parts camera 60 before the mounting.

Figure 6:
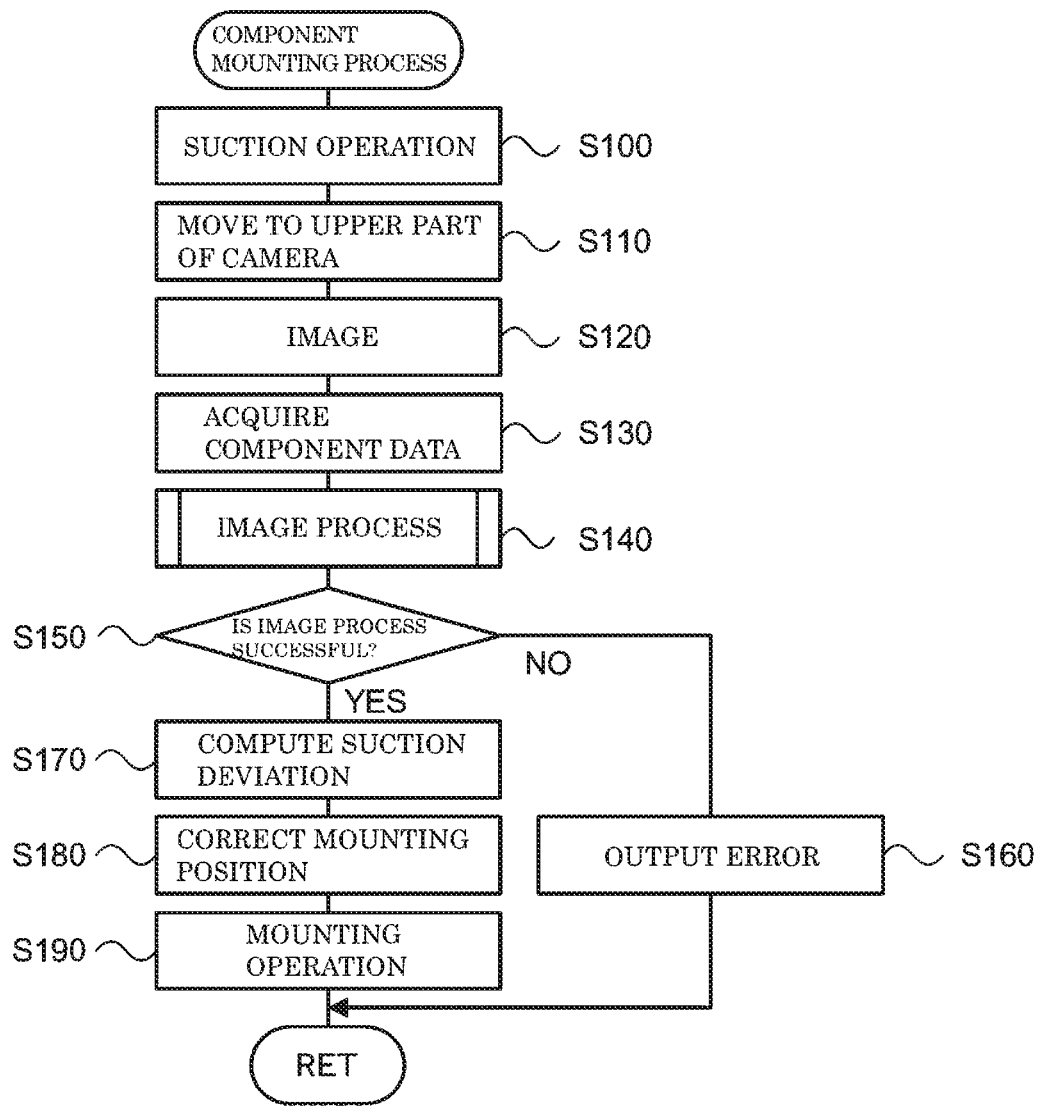
FIG. 6 is a flowchart illustrating an example of component mounting process which is performed by a control device 70 of the component mounting machine 10.

Next, an operation of the component mounting system 1 (component mounting machine 10) of the embodiment configured in this manner, will be described. FIG. 6 is a flowchart illustrating an example of component mounting processing which is performed by the CPU 71 of the control device 70. The processing is performed when the start of the production is indicated by the operator. The control device 70 receives the production plan sent from the management device 80, and performs the component mounting process according to the received production plan.

When the component mounting process is performed, the CPU 71 of the control device 70 performs, first, a suction operation of suctioning the component P supplied from the component supply device 20 to the suction nozzle 51 (S100). Here, specifically, after driving and controlling the XY robot 40 so that the suction nozzle 51 mounted on the head 50 comes immediately above the component P, the suction operation is performed by driving and controlling the Z-axis actuator 52 so that the suction nozzle 51 is lowered until the suction port abuts against the component P, and by driving and controlling the electromagnetic valve 57 so that the negative pressure acts on the suction port of the suction nozzle 51. Next, the CPU 71 drives and controls the XY robot 40 so that the component P suctioned to the suction nozzle 51 moves to the upper part of the parts camera 60 (S110), and images the component P by the parts camera 60 (S120).

Figure 7:
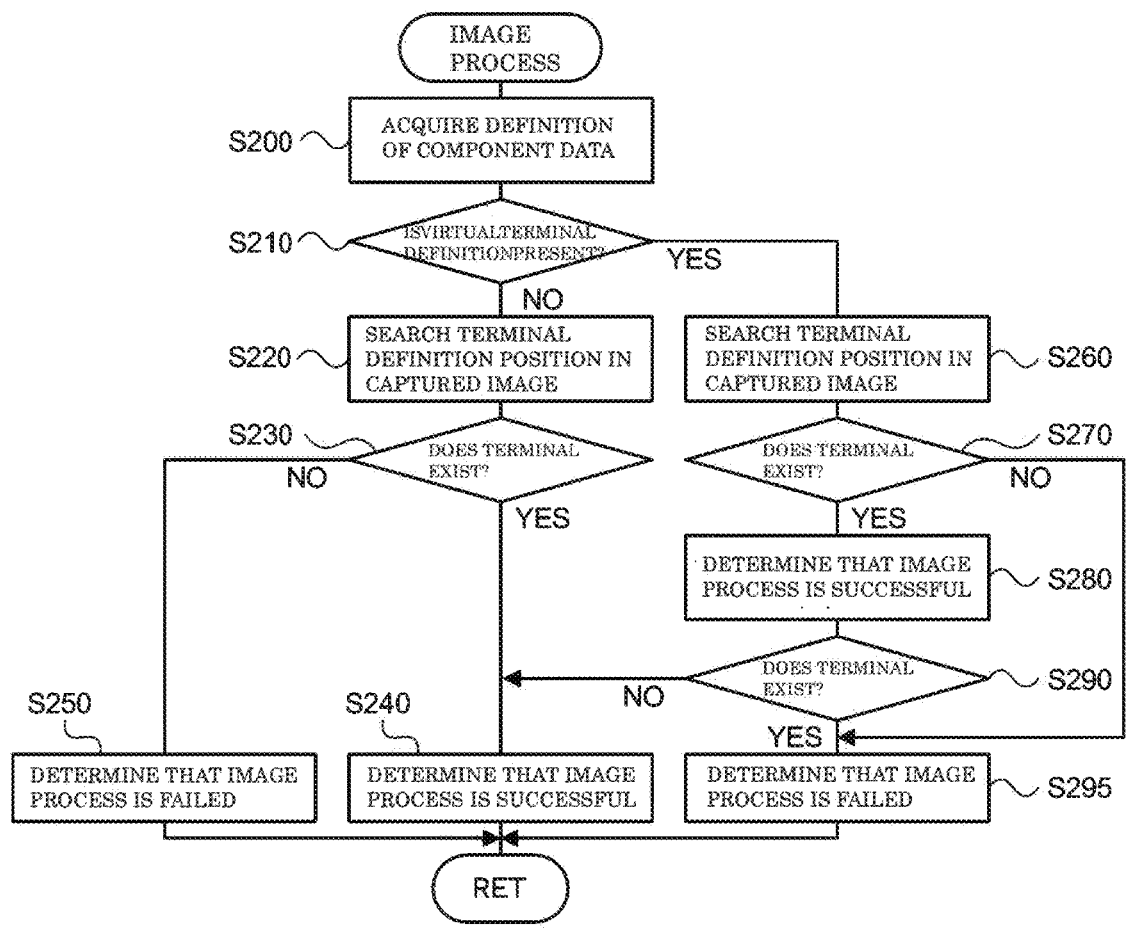
FIG. 7 is a flowchart illustrating an example of image process.

Next, the CPU 71 acquires the component data related to the production from the received production plan (S130), and performs the image process which is illustrated as an example in FIG. 7 with respect to the captured image acquired by the imaging in S120 (S140) by using the acquired component data. Here, the description of the component mounting process is stopped, and the image process will be described in detail.

When the image process is performed, the CPU 71 acquires the definition (terminal definition, virtual terminal definition) of the acquired component data (S200), and determines whether or not the virtual terminal definition is included in the acquired definition (S210). When the CPU 71 determines that the virtual terminal definition is not included, a peripheral pixel which is at a certain position of the terminal definition in the captured image imaged in S120 of the component mounting process, is searched (S220), and determines whether or not it is possible to recognize that the terminals exist at all the certain positions of the terminal definition (S230). Specifically, processing of S220 is processing of extracting a pixel value (luminance value) of the peripheral pixel which is at a certain position of the terminal definition, and specifically, processing of S230 is processing of determining whether or not the extracted pixel value is equal to or greater than a threshold value. Here, in general, the component P has been subjected to low reflection processing so that the reflection of the emitted light is suppressed. Therefore, the captured image acquired by imaging the component P becomes an image in which a terminal part is reflected to be white, and other body parts are reflected to be black. Therefore, in a case where the pixel value at a certain position of the terminal definition is equal to or greater than the threshold value, it is possible to determine that the pixel is a pixel in which the terminal is reflected. However, in a case where a mark, a character, or a logo is attached to the component P, since these parts are reflected to be whiter, there is also a case where the pixel value of the pixel in which these are reflected becomes equal to or greater than the threshold value. In the embodiment, by determining whether the pixel value is equal to or greater than the threshold value only for pixels peripheral to positions at which terminals are defined, misrecognition of items other than a terminal, such as a mark, a character, or a logo, as a terminal is prevented.

When it is determined that it is possible to recognize that the terminals exist at all the certain positions of the terminal definition in S230, the CPU 71 determines that the image process is successful (determines that the component P suctioned to the suction nozzle 51 is a correct component) (S240), and finishes the image process. When it is determined that it is not possible to recognize that the terminal exists at any one of the certain positions of the terminal definition, the CPU 71 determines that the image process is failed (determines that the component P suctioned to the suction nozzle 51 is not a correct component) (S250), and finishes the image process.

Figure 8:
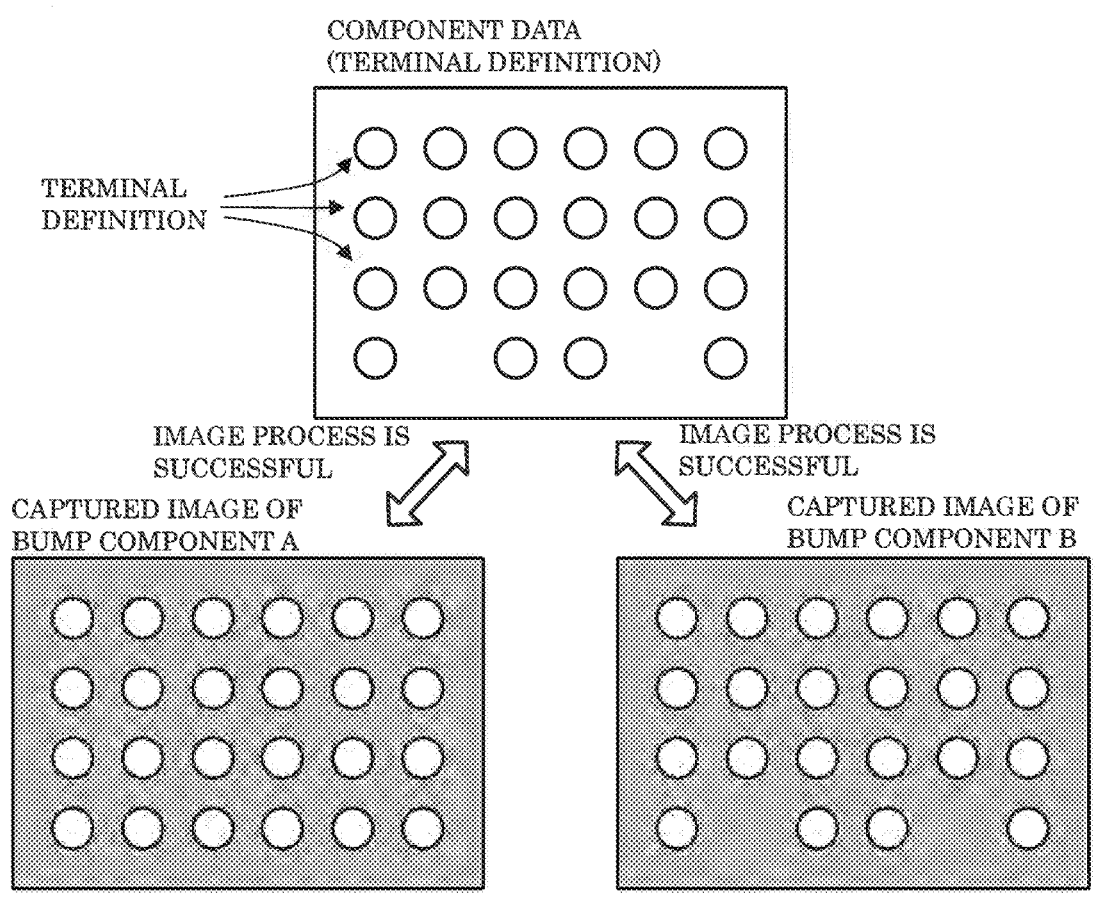
FIG. 8 is an explanation view illustrating a state in which the image process is performed with respect to a captured image by using the component data.

FIG. 8 is an explanation view illustrating an aspect in which the image process is performed with respect to the captured image by using the component data. As illustrated in FIG. 8, in a case where the image process is performed with respect to the captured image acquired by imaging a bump component B, by using the component data of the bump component B, as illustrated in FIG. 8, since it is recognized that the terminals exist at all the certain positions of the terminal definition, the image process is successful. Meanwhile, in a case where the image process is performed with respect to the captured image acquired by imaging a bump component A in which the positional coordinate (terminal-to-terminal pitch) when the bump component B and the terminal exist, and the terminal size are the same as each other, and the number of terminals is large, by using similar component data of the bump component B, since it is also recognized that the terminals exist at all the certain positions of the terminal definition, the image process is successful. In other words, only by the terminal definition of the component data of the bump component B, since the image process is successful in any of the bump component A and the bump component B, there is a case where it is not possible to recognize the bump component correctly.

When it is determined that the virtual terminal definition is included in the definition acquired in S210, similar to S220 and S230, the CPU 71 searches the peripheral pixel at the certain position of the terminal definition in the captured image (S260), and determines whether or not it is possible to recognize that the terminals exist at all the certain positions of the terminal definition (S270). When it is determined that it is possible to recognize that the terminals exist at all the certain positions of the terminal definition, then, the CPU 71 searches the peripheral pixel at the certain position of the virtual terminal definition in the captured image (S280), and determines whether or not it is possible to recognize that the terminals do not exist at all the certain positions of the virtual terminal definition (S290). Specifically, processing of S280 is processing of extracting the pixel value (luminance value) of the peripheral pixel which is at a certain position of the virtual terminal definition, and specifically, processing of S290 is processing of determining whether or not the extracted pixel value is less than the threshold value. When it is determined that it is possible to recognize that the terminals do not exist at all certain positions of the virtual terminal definition, the CPU 71 determines that the image process is successful (S240), and finishes the image process. When it is determined that it is not possible to recognize that the terminal exists at any one of the certain positions of the terminal definition in S270, or determines that it is not possible to recognize that the terminal does not exist at any one of the certain positions of the virtual terminal definition in S290, the CPU 71 determines that the image processing is failed (S295), and finishes the image processing.

Figure 9:
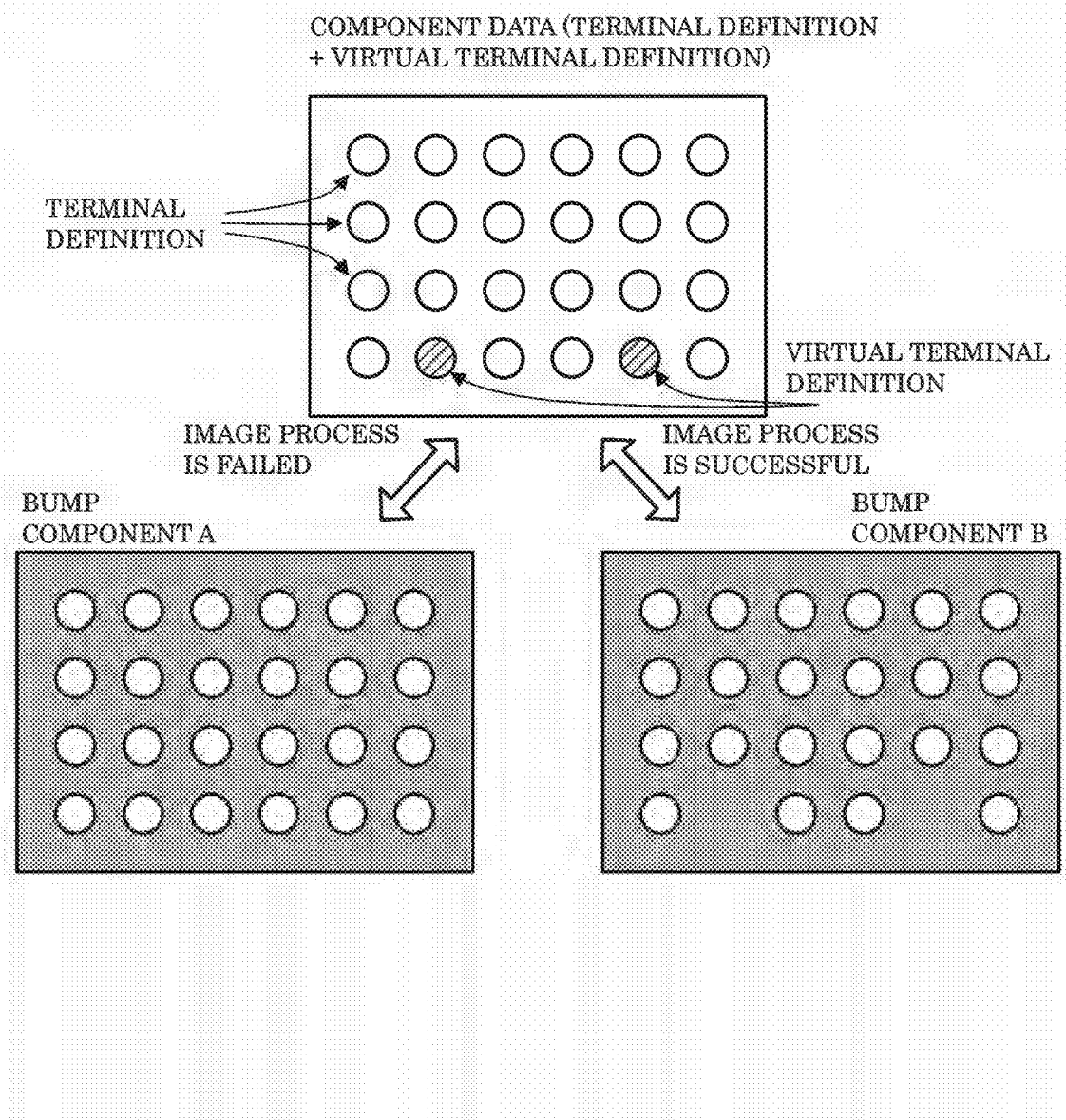
FIG. 9 is an explanation view illustrating an aspect in which the image process is performed with respect to the captured image by using the component data to which virtual terminal definition is added.

FIG. 9 is an explanation view illustrating an aspect in which the image process is performed with respect to the captured image by using the component data to which the virtual terminal definition is added. As illustrated in FIG. 9, in a case where the image process is performed with respect to the captured image acquired by imaging a bump component B, by using the component data of the bump component B, as illustrated in FIG. 9, since it is recognized that the terminals exist at all the certain positions of the terminal definition, and it is recognized that the terminals do not exist at all certain positions of the virtual terminal definition, the image process is successful. Meanwhile, in a case where the image process is performed with respect to the captured image acquired by imaging the bump component A in which the positional coordinate (terminal-to-terminal pitch) of the terminal when the bump component B and the terminal exist, and the terminal size are the same as each other, and the number of terminals is large, by using similar component data of the bump component B, it is recognized that the terminals exist at all the certain positions of the terminal definition, but since it is recognized that the terminal also exist at a certain position of the virtual terminal definition, the image process is failed. In this manner, by adding the virtual terminal definition to the component data, it is possible to identify the plural bump components in which the positional coordinate (terminal-to-terminal pitch) of the terminal and the terminal size are substantially the same as each other, and the number of terminals is different, from each other.

Returning to the component mounting process, when performing the image process in S140, the CPU 71 determines whether or not the image process is successful (S150). When it is determined that the image process is failed, the CPU 71 outputs an error (S160), and finishes the component mounting process. In addition, processing of S160 is performed by sending error information related to a component mistake error to the management device 80. The management device 80 which receives the error information notifies the component mistake error to the operator by generating a warning sound together with displaying a warning screen on the display 88. Meanwhile, when it is determined that the image process is successful, the CPU 71 computes a suction deviation of the component P based on the captured image (S170), corrects the mounting position based on the computed suction deviation (S180), performs the mounting operation of mounting the component P suctioned to the suction nozzle 51 on the mounting position of the board S (S190), and finishes the component mounting process. Here, specifically, after driving and controlling the XY robot 40 so that the component P mounted on the suction nozzle 51 comes immediately above the mounting position of the printed circuit board S, the mounting operation is performed by driving and controlling the Z-axis actuator 52 so that the suction nozzle 51 is lowered until the component P abuts against the mounting position of the printed circuit board S, and by driving and controlling the electromagnetic valve 57 so that the positive pressure acts on the suction port of the suction nozzle 51.

Figure 10:
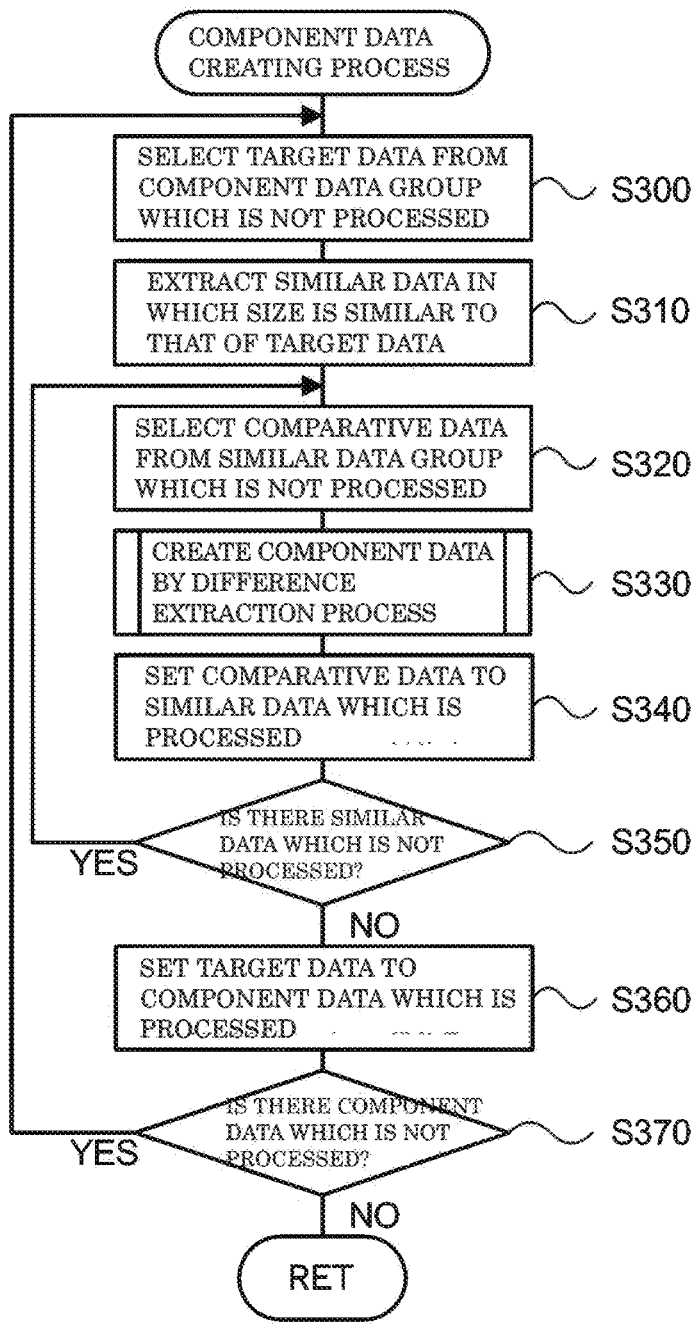
FIG. 10 is a flowchart illustrating an example of component data creating process performed by the management device 80.

Next, the component data creating process of creating the component data to which the virtual terminal definition is added will be described. The creation of the component data is performed by the management device 80 based on the data input by the operator. FIG. 10 is a flowchart illustrating an example of the component data creating processing performed by the CPU 81 of the management device 80.

When the component data creating processing is performed, the CPU 81 of the management device 80, first, selects one piece of target data from a component data group which is not processed stored in the HDD 83 (S300), and extracts similar data of which the body size and the terminal size are close (substantially the same) to those of the target data from the component data group stored in the HDD 83 (S310). Processing of S310 is processing of searching and extracting a certain piece of component data of which each size difference of the body size and the terminal size between the component data and the target data is within any error range. In this manner, when extracting the similar data, the CPU 81 selects one piece of comparative data from the data which is not processed among the extracted similar data (S320), and creates component data to which the virtual terminal definition is added by performing difference extraction process illustrated as an example in FIG. 11 by using each of the selected target data and the comparative data (S330).

Figure 11:
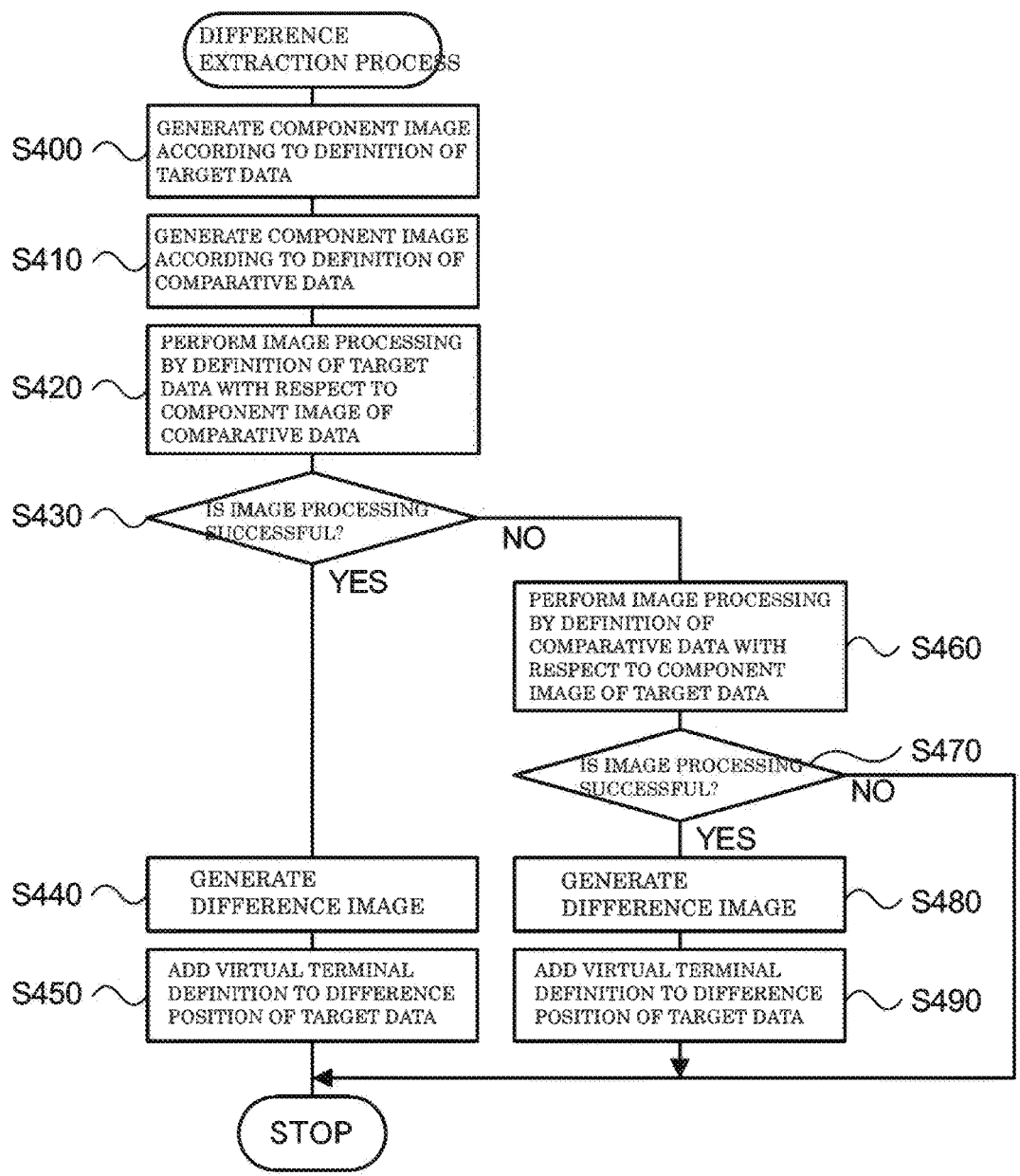
FIG. 11 is a flowchart illustrating an example of a difference extraction process.

When the difference extraction process of FIG. 11 is performed, the CPU 81 of the management device 80 generates a component image similar to the captured image by laying out a terminal image according to the definition (terminal definition) of the target data (S400). Next, the CPU 81 generates the component image similar to the captured image by laying out the terminal image according to the definition (terminal definition) of the comparative data (S410), and performs the image process illustrated in FIG. 7 by the definition of the target data with respect to the component image of the generated comparative data (S420). As a result of the image process, when it is determined that the image process is successful (S430), the CPU 81 generates a difference image by taking a difference between the component image of the comparative data generated in S410, and the component image of the target data generated in S400 (S440), adds the virtual terminal definition to the target data at a certain position (difference position) of the difference image (creates the component data acquired by adding the virtual terminal definition to the target data) (S450), and finishes the difference extraction process. Meanwhile, when it is determined that the image process is failed in S430, the CPU 81 performs the image process illustrated in FIG. 7 by the definition of the comparative data with respect to the component image of the target data generated in S400 (S460). As a result of the image process, when it is determined that the image process is successful (S470), the CPU 81 generates the difference image by taking the difference between the component image of the target data generated in S400, and the component image of the comparative data generated in S410 (S480), adds the virtual terminal definition to the comparative data at a certain position (difference position) of the difference image (creates the component data acquired by adding the virtual terminal definition to the comparative data) (S490) and, finishes the difference extraction process. In addition, when it is determined that the image process is failed in S470, the CPU 81 finishes the difference extraction process without adding the virtual terminal definition.

Returning to the component data creating process, when creating the component data by the difference extraction process in S330, the CPU 81 sets the comparative data to similar data which is processed (S340), and after this, determines whether or not the similar data which is not processed is present (S350). When it is determined that the similar data which is not processed is present, returning to S320, the CPU 81 selects new one piece of comparative data, and repeats the processing of S330 and S340, and when it is determined that the similar data which is not processed is not present, the CPU 81 sets the target data to the component data which is processed (S360), and after this, determines whether or not another piece of the component data which is not processed and can become the target data is present (S370). When it is determined that another piece of the component data which is not processed is present, returning to S300, the CPU 81 selects new one piece of target data, and repeats the processing of S310 to S360, and when it is determined that another piece of the component data which is not processed is not present, the component data creating process is finished.

Figure 12:
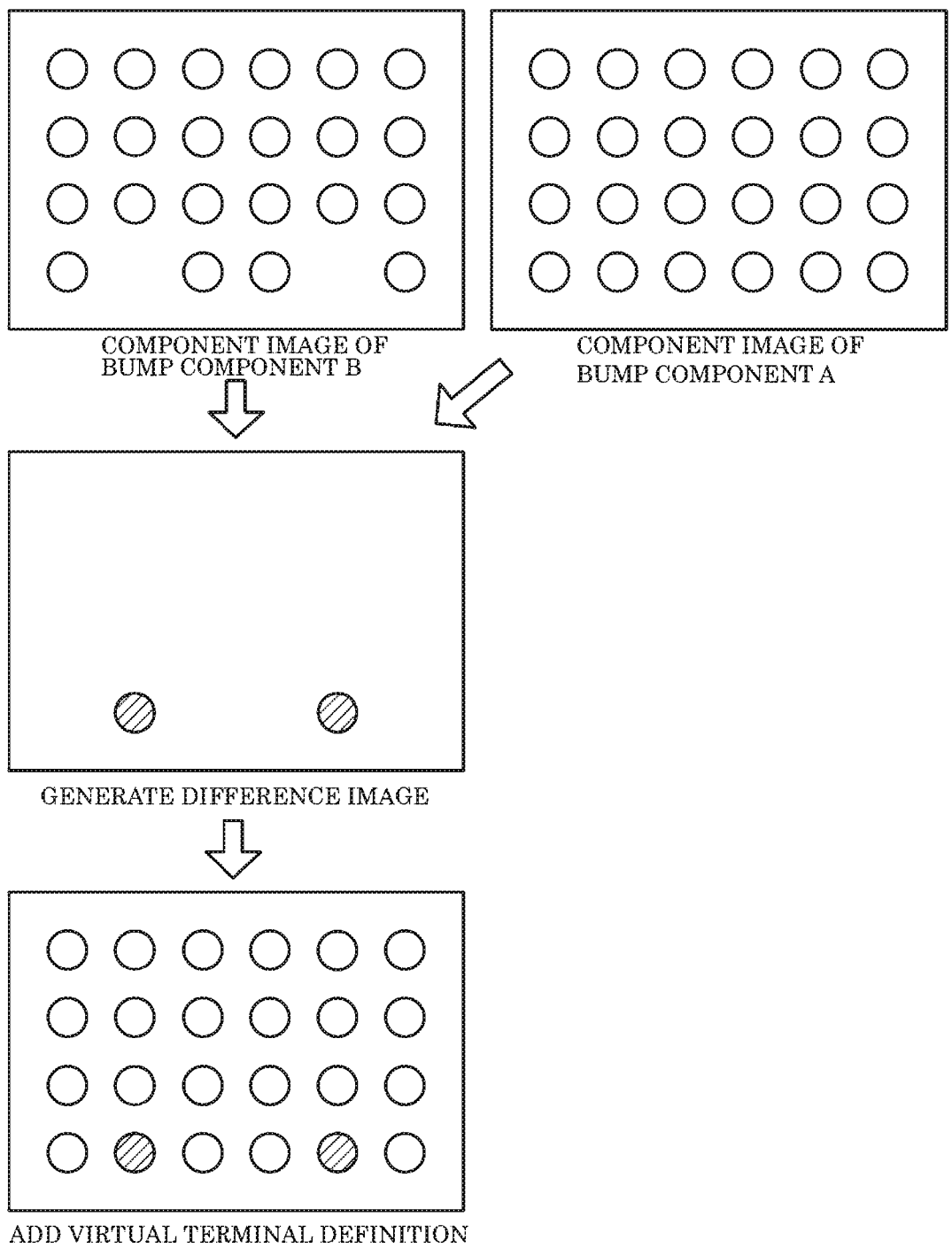
FIG. 12 is an explanation view illustrating an aspect in which the virtual terminal definition is added to the component data.

FIG. 12 is an explanation view illustrating an aspect in which the component data acquired by adding the virtual terminal definition is created. As illustrated in FIG. 12, in a case where the image process of S420 or S460 of the difference extraction process is performed by using the terminal definition of the bump component B with respect to the component image of the bump component A in which the positional coordinate (or the terminal-to-terminal pitch) between the existing terminals, and the terminal size are substantially the same as those of the bump component B, and the number of terminals is large, the image process is successful. Therefore, the difference image is generated by taking the difference between the component image of the bump component A and the component image of the bump component B by S440 or S480 of the difference extraction process. The difference image becomes the terminal image which indicates the terminal that exists only in the bump component A. Therefore, the virtual terminal definition which defines that the terminal does not exist at the difference position is added to the component data of the bump component B. Accordingly, as illustrated in the above-described FIG. 9, in a case where the image process is performed with respect to the captured image acquired by imaging the bump component B by using the component data of the bump component B, the image process can be successful, and in a case where the image process is performed with respect to the captured image acquired by imaging the bump component A by using the component data of the bump component B, the image process can be failed.

The component mounting system 1 of the above-described embodiment extracts the plural pieces of component data in which the positional coordinate (or the terminal-to-terminal pitch) between the existing terminals, and the terminal size are substantially the same, and the number of terminals is different. Accordingly, it is possible to extract the plural pieces of component data which has a concern of being misrecognized, and by using the extracted component data, it is possible to suppress misrecognition of the component P to be mounted, and to recognize the component P correctly.

In addition, the component mounting system 1 of the embodiment adds the virtual terminal definition which defines that the terminal does not exist, to the component data on one side, at a position (difference position) of the terminal which does not exist in the component data on one side, and exists in the component data on the other side, among the plural pieces of component data in which the positional coordinate (or the terminal-to-terminal pitch) between the existing terminals, and the terminal size are substantially the same as each other, and the number of terminals is different. In a case where the image processing is performed with respect to the captured image of the component P by using the component data to which the virtual terminal definition is added, it is recognized that the terminals exist at all certain positions of the terminal definition, and in a case where it is recognized that the terminals do not exist at all certain positions of the virtual terminal definition, by determining that the image processing is successful, it is possible to discriminate the plurality of components which are similar to each other, and to prevent the misrecognition of the component. In addition, by narrowing the range in which the terminal is recognized to a certain position of the terminal definition and a certain position of the virtual terminal definition, the component mounting system 1 of the embodiment can prevent misrecognition of glare, such as a mark or a wiring pattern attached to the component P, as a terminal.

In the embodiment, in the difference extraction process of FIG. 11, by generating the component image according to the definition of the comparative data, by performing the image process by the definition of the target data with respect to the component image of the generated comparative data, by generating the component image according to the definition of the target data, and by performing the image process by the definition of the comparative data with respect to the component image of the generated target data, it is determined whether or not the positional coordinate between the existing terminals or the terminal-to-terminal pitch is substantially the same as each other between the target data and the comparative data. However, not being limited thereto, by directly comparing the certain position of the definition of the target data and the certain position of the definition of the comparative data, it may be determined whether or not the positional coordinate between the existing terminals or the terminal-to-terminal pitch is substantially the same as each other therebetween.

In the embodiment, the virtual terminal definition is automatically added to the component data by performing the component data creating process of FIG. 10, but the disclosure is not limited thereto. For example, by performing the component data creating process of an alternative embodiment illustrated in FIG. 13, similar data in which the terminal size or the positional coordinate of the terminal (or the terminal-to-terminal pitch) is similar to each other is searched and is integrally displayed as a list, and additional input of the virtual terminal definition by the operator may be supported.

Figure 13:
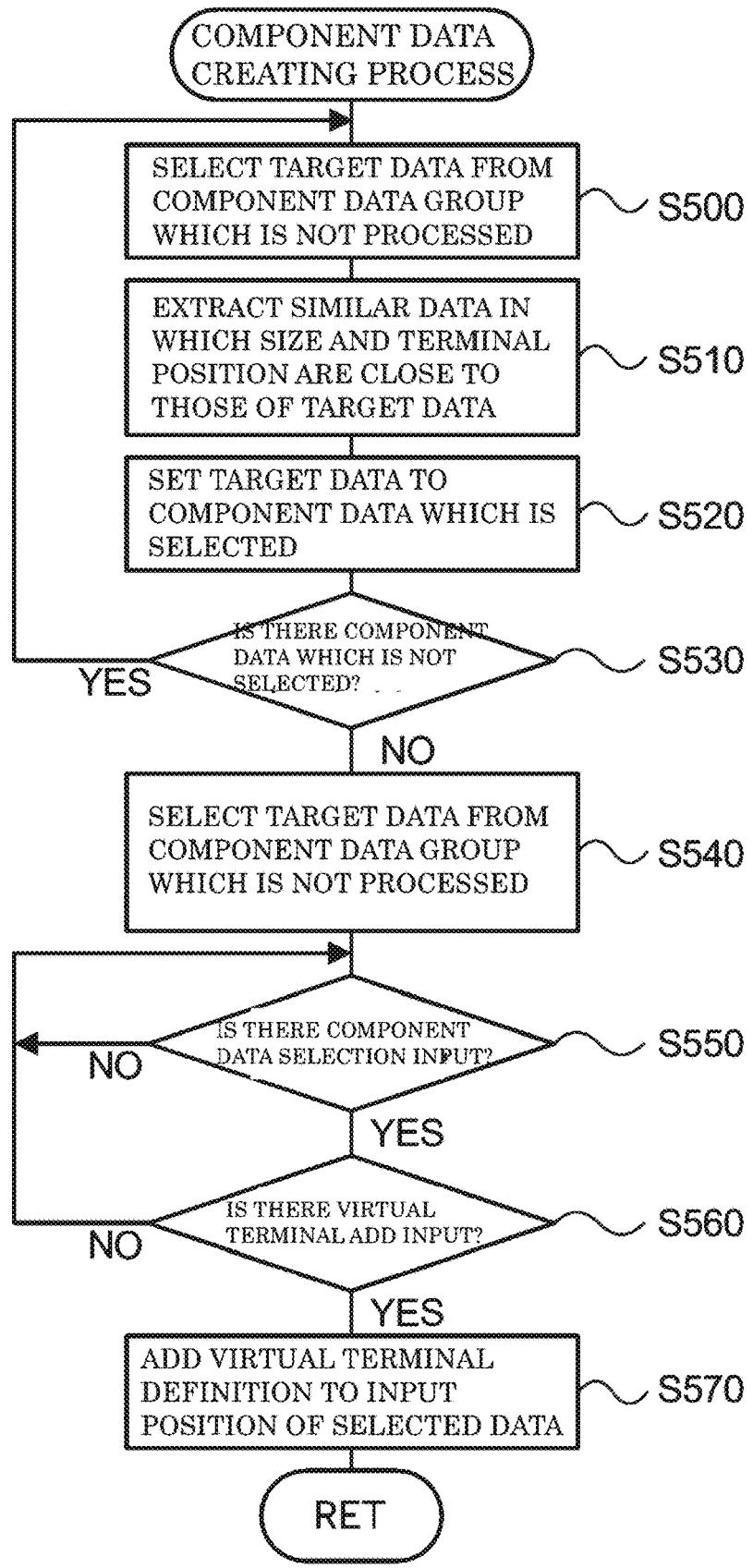
FIG. 13 is a flowchart illustrating an example of component data creating process of an alternative embodiment.
Figure 14A:
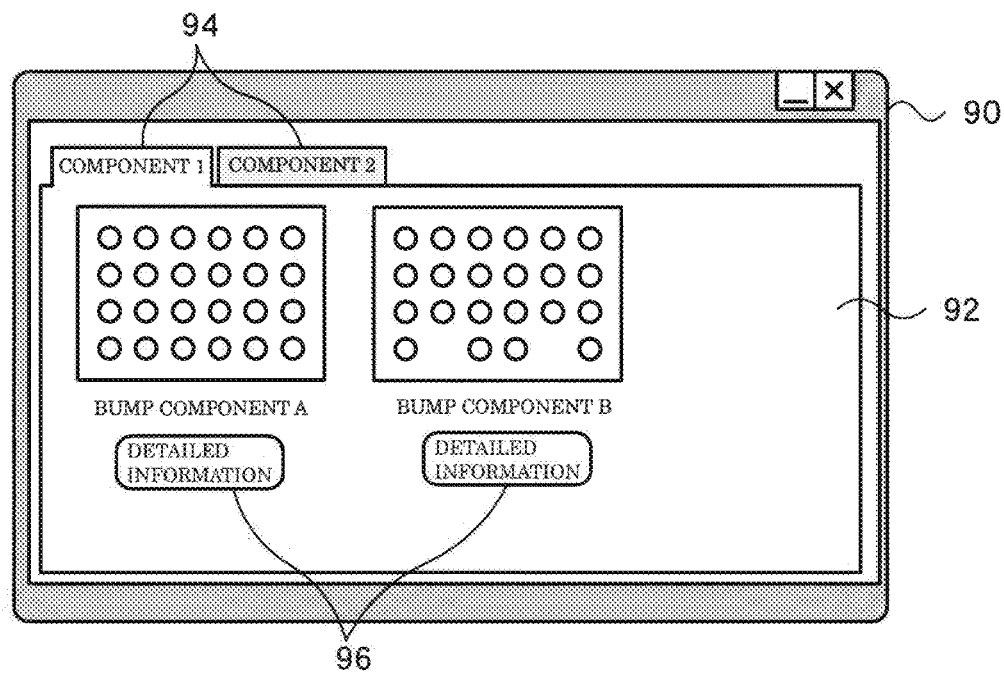
FIGS. 14A and 14B are explanation views illustrating an example of a component data display screen 90.
Figure 14B:
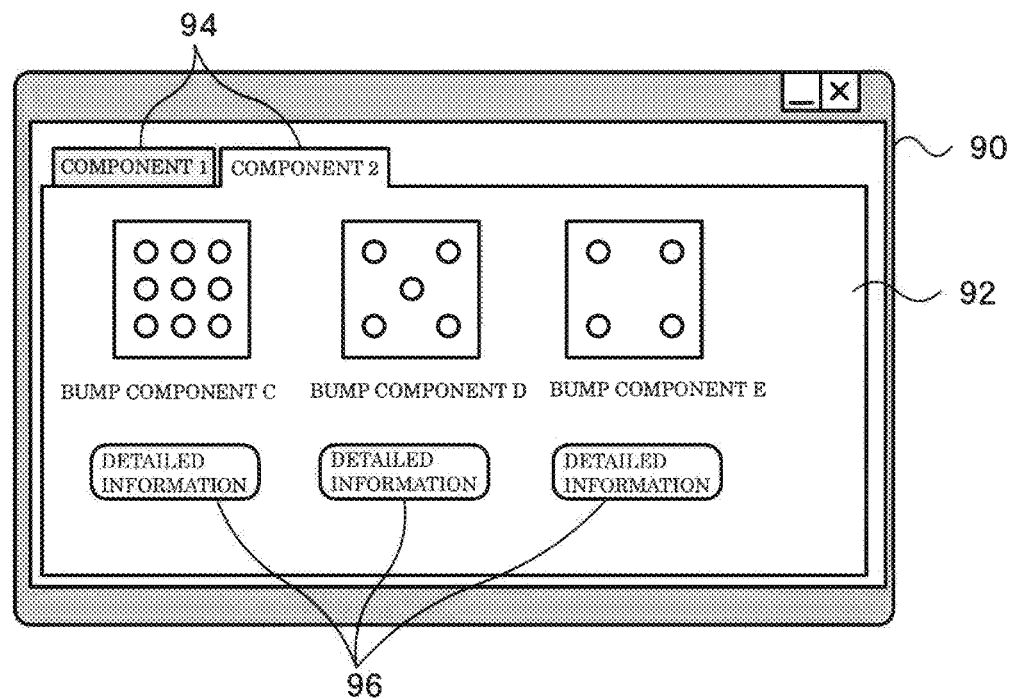

When the component data creating process of FIG. 13 is performed, the CPU 81 of the management device 80 selects one piece of target data from the component data group which is not processed among the component data stored in the HDD 83 (S500), and extracts the similar data in which the body size, and the terminal size between the existing terminals and the positional coordinate (or the terminal-to-terminal pitch) are close (substantially the same) to those of the selected target data (S510). In addition, the CPU 81 sets the target data to the component data which is selected (S520), and determines whether or not the component data which is not selected is present (S530). When it is determined that the component data which is not selected is present, returning to S500, the CPU 81 selects new one piece of target data, and repeats the processing of S510 and S520. Meanwhile, when it is determined that the component data which is not selected is not present, the CPU 81 integrally displays the component data as a list for each piece of similar data similar to each other (S540). FIGS. 14A and 14B are explanation views illustrating an example of a component data display screen 90. A component data display screen 90 includes a component data display region 92 which displays the similar data (component image) in which the size and the positional coordinate (or the terminal-to-terminal pitch) are substantially the same as a list in a thumbnail format, a tab region 94 in which a plurality of tabs which are correlated to each similar data are aligned, and a detail display instruction region 96 for calling details (for example, detail display of the component type, the body size, the terminal size, or the number of the terminals) of the component data displayed in the component data display region 92. It is possible to switch component data (similar data) displayed in the component data display region 92 by clicking a mouse matching a cursor to any of the plural tabs of the tab region 94.

Figure 15A:
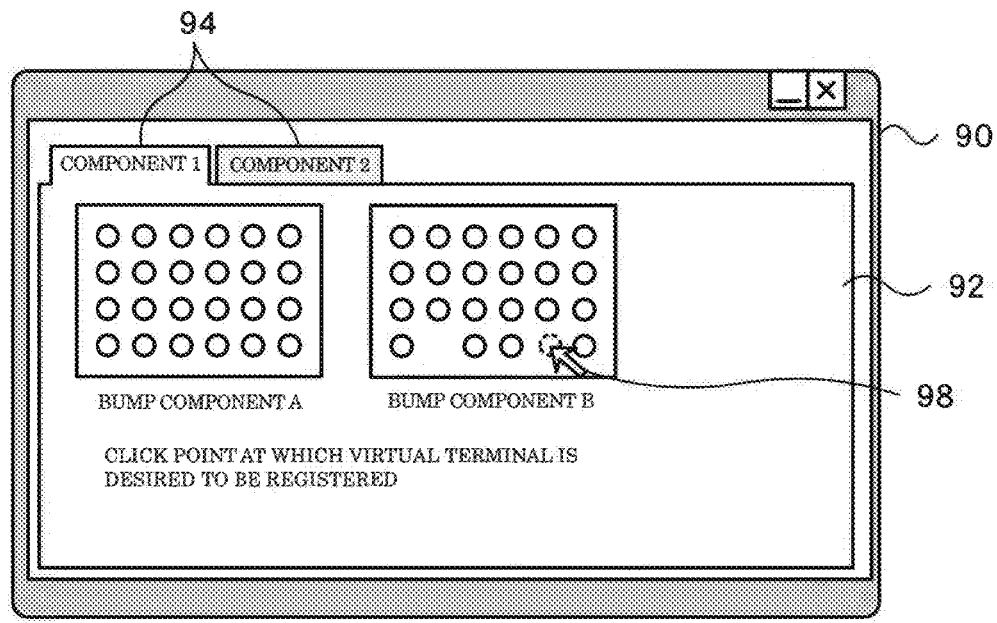
FIGS. 15A, 15B and 15C are explanation views illustrating an aspect in which the virtual terminal definition is added to the component data by using the component data display screen 90.
Figure 15B:
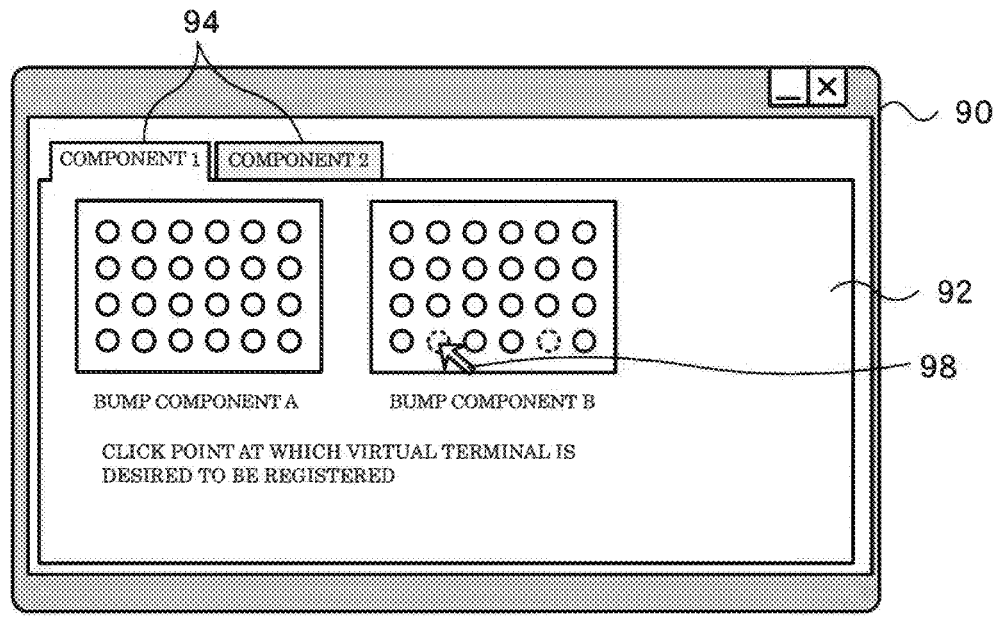
Figure 15C:
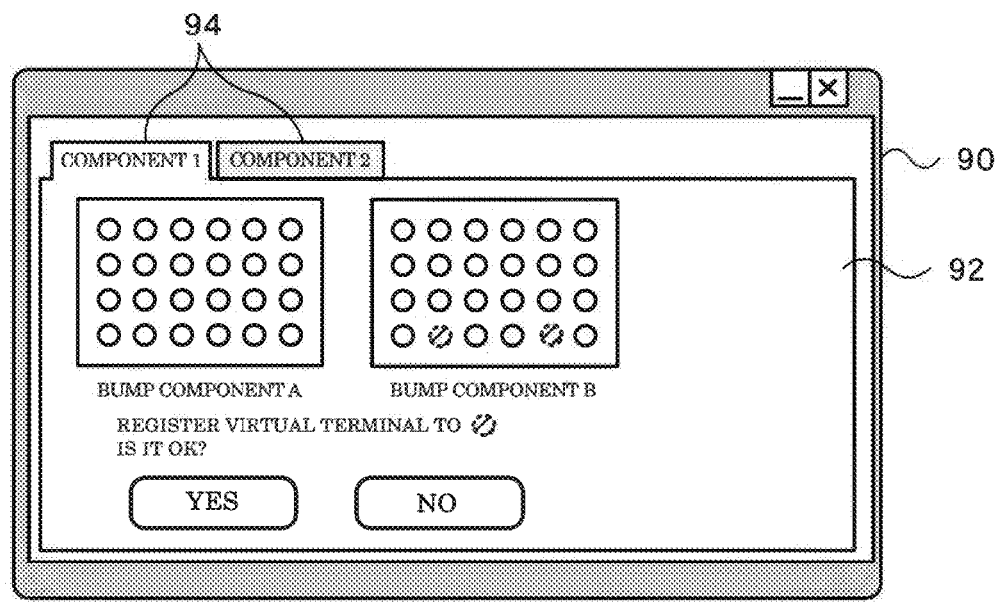

In addition, by the operator, the CPU 81 determines whether or not a selecting operation of the component data is performed (S550), and whether or not the additional operation of the virtual terminal is performed (S560) respectively, and when it is determined that the selecting operation of the component data is performed and the input operation of the virtual terminal is performed, the virtual terminal definition is added to the position at which the selected component data is input (S570), and the component data creating process is finished. FIG. 15 is an explanation view illustrating an aspect in which the virtual terminal definition is added to the component data by using the component data display screen 90. As illustrated in FIG. 15, the addition of the virtual terminal definition can be performed by matching a cursor 98 to "YES", and clicking the mouse (refer to FIG. 15C), after matching the cursor 98 to a position at which the operator desires to add the virtual terminal definition, and clicking the mouse (refer to FIGS. 15A and 15B). In addition, it is possible to cancel the addition of the virtual terminal definition by matching the cursor 98 to "NO", and clicking the mouse.

In the embodiment, the present disclosure is described being employed in the bump component having the bump terminal, but not being limited thereto, it is also possible to employ the present disclosure in any type of component if the component is a lead component which has a lead terminal or a component having a terminal which has a terminal.

Here, a correspondence relationship between a main element of the embodiment and a main element of the disclosure described in the disclosure of the disclosure, will be described. In other words, the management device 80 corresponds to "data handling device," the HDD 83 corresponds to "component data storage device," and the CPU 81 of the management device 80 which performs processing of S500 to S530 of the component data creating process of FIG. 13 corresponds to "component data extracting device." In addition, the CPU 81 and the display 88 of the management device 80 which perform the processing of S540 of the component data creating process of FIG. 13 correspond to "displaying device." In addition, the CPU 81 of the management device 80 which performs processing of S400 to S430, S460, and S470 of the component data creating process of FIG. 10 and the difference extraction process of FIG. 11 also corresponds to "component data extracting device," and the CPU 81 of the management device 80 which performs processing of S440, S450, S480, and S490 of the difference extraction process corresponds to "component data creating device." In addition, the CPU 71 of the control device 70 which performs processing of S120 of the component mounting process of FIG. 6 corresponds to "captured image acquisition device," and the CPU 71 of the control device 70 which performs processing (image process of FIG. 7) of S140 of the component mounting process corresponds to "discriminating device." In addition, in the embodiment, the component data is stored in the HDD 83 of the management device 80, and the CPU 81 of the management device 80 performs the component data creating process of FIG. 10 or FIG. 13. However, not being limited thereto, the component data may be stored in the HDD 73 of the control device 70, and the CPU 71 of the control device 70 may perform the component data creating process. In this case, the control device 70 corresponds to "data handling device." In addition, in the embodiment, the CPU 71 of the control device 70 performs the processing (image process) of S140 of the component mounting process of FIG. 6, but not being limited thereto, the CPU 81 of the management device 80 may acquire the captured image acquired by imaging the component P from the control device 70 in S120 of the component mounting process, and perform the image process.

In addition, the present disclosure is not limited to the above-described embodiment, and may be realized in various aspects as long as being included in the technical scope of the present disclosure.

INDUSTRIAL APPLICABILITY

The present disclosure can be used in manufacturing industry of the component mounting system or the like.

REFERENCE SIGNS LIST

1: component mounting system, 10: component mounting machine, 11: base, 12: main body frame, 14: support table, 20: component supply device, 30: board conveyance device, 32: belt conveyor device, 34: back-up plate, 40: XY robot, 41: X-axis guide rail, 42: X-axis slider, 43: Y-axis guide rail, 44: Y-axis slider, 46: X-axis actuator, 47: X-axis position sensor, 48: Y-axis actuator, 49: Y-axis position sensor, 50: head, 51: suction nozzle, 52: Z-axis actuator, 54: θ-axis actuator, 56: mark camera, 57: electromagnetic valve, 58: vacuum pump, 59: air pipe, 60: parts camera, 62: imaging device, 64: lens, 66: first lighting device, 68: second lighting device, 70: control device, 71: CPU, 72: ROM, 73: HDD, 74: RAM, 75: input and output interface, 76: bus, 80: management device, 81: CPU, 82: ROM, 83: HDD, 84: RAM, 85: input and output interface, 86: bus, 87: input device, 88: display, 90: component data display screen, 92: component data display region, 94: tab region, 96: detail display instruction region, 98: cursor, S: board, P: component

The invention claimed is:

1. A component data handling device for a component mounting machine in which the component data handling device handles component data used by the component mounting machine during mounting of a component having a terminal on a mounting target, the component data handling device comprising:
   a component data storage device which stores plural pieces of the component data including a terminal size, a terminal-to-terminal pitch or a terminal position, and the number of terminals; and
   a processor comprises a component data extraction device operatively connected to the component data storage device and configured to perform the component data creating process by:
   select a target data from a component data group, the target data not being processed among the component data stored on the component data storage device,
   extract the component data from the plural pieces of the component data stored on the component data storage device in which the terminal size, and the terminal-to-terminal pitch or the terminal position of the extracted component data are substantially the same as the target data, and the number of terminals of the extracted component data is different than the target data, and
   set the extracted component data as the target data.

2. The component data handling device according to claim 1, further comprising:
   a displaying device operatively connected to the processor and which integrally displays the extracted component data.

3. The component data handling device according to claim 1,
   wherein the processor is configured to
   create the component data by detecting a position at which a terminal exists only on one side on the terminal-to-terminal pitch or on the terminal position between a first piece of the component data and a second piece of the component data, and by adding information that indicates that the terminal does not exist at the detected position.

4. The component data handling device according to claim 3, wherein the processor is configured to
   capture a captured image of the component having a terminal which is imaged before mounting; and
   discriminate the component having a terminal based on the component data stored in the component data storage device or the created component data created by the processor, and the captured image.

5. A component mounting system comprising:
   a component mounting machine which mounts a component having a terminal on a mounting target; and
   the component data handling device according to claim 1 which handles component data which is used when the component having a terminal is mounted by the component mounting machine.

* * * * *